United States Patent [19]

White

[11] Patent Number: 4,667,620

[45] Date of Patent: May 26, 1987

[54] METHOD AND APPARATUS FOR MAKING PLASTIC CONTAINERS HAVING DECREASED GAS PERMEABILITY

[75] Inventor: Gerald W. White, Dallas, Tex.

[73] Assignee: Cosden Technology, Inc., Dallas, Tex.

[21] Appl. No.: 792,379

[22] Filed: Oct. 29, 1985

[51] Int. Cl.⁴ .................... C23C 14/00; C23C 16/00; B05B 5/02; B05D 3/14

[52] U.S. Cl. .................... 118/50.1; 118/623; 118/624; 118/627; 118/640; 118/720; 118/721; 118/723; 427/38; 427/40; 427/47

[58] Field of Search .................... 427/38, 40, 47; 118/50.1, 624, 627, 640, 623, 715, 723, 720, 721

[56] References Cited

U.S. PATENT DOCUMENTS

| | | | |
|---|---|---|---|
| 4,401,054 | 8/1983 | Matsuo et al. | 118/723 |
| 4,478,874 | 10/1984 | Hahn | 427/40 |
| 4,481,229 | 11/1984 | Suzuki et al. | 427/38 |
| 4,487,162 | 12/1984 | Cann | 118/723 |
| 4,522,844 | 6/1985 | Khanna et al. | 427/38 |

Primary Examiner—Thurman K. Page
Attorney, Agent, or Firm—Roy L. Van Winkle; M. Norwood Cheairs

[57] ABSTRACT

Apparatus for producing open ended plastic containers having decreased gas permeability that includes a vacuum chamber and a pump for regulating the pressure therein, an ionization source mounted in the chamber proximate the container's open end and a container holder located in the chamber. The container holder has a hole aligned with the open end and may include a shield that encompasses the exterior of the container and may include a magnet setting up a magnetic field on the exterior of the shield. In the method, a container is placed on the container holder in the chamber with the open end and hole aligned and with the shield and magnet located as described above. The coating material is vaporized and ionized so that the ionized material is deposited on the interior wall of the container.

10 Claims, 2 Drawing Figures

METHOD AND APPARATUS FOR MAKING PLASTIC CONTAINERS HAVING DECREASED GAS PERMEABILITY

BACKGROUND OF THE INVENTION

The present invention relates generally to plastic containers. More particularly, but not by way of limitation, this invention relates to an improved method and apparatus for making containers, such as bottles and cans, having improved gas transmission barrier characteristics.

In the food and beverage industry the trend is to move away from packaging perishable products in glass and metal containers and to substitute thermoplastic polymers for the container material. One of the most successful polymers for beverage containers to package beer, wine, and soft drinks has been polyethylene terephthalate (PET). One of the largest markets for PET containers has been in the two-liter carbonated drink field. Another area where PET is expected to be used extensively is in packaging beer and food. In either case, one of the most critical characteristics of the polyester package is the prevention of gas permeation through the wall of the container.

With carbonated soft drinks, the problem with gas permeation is the loss of carbonation ($CO_2$ gas) from the drink through the wall of the bottle or can. Compared to the small, densely-packed metal and glass molecules, polymer molecules are relatively large and form a permeable wall. Even the best polymer known at this time for gas barrier properties, ethylene vinyl alcohol (EVOH), has poor barrier ability when compared to the inorganics such as metals and glass.

On the other hand, beer and food containers preferably should present a good vapor barrier against the ingress of oxygen ($O_2$) into the container because of the accelerated spoilation of the food products caused by the presence of oxygen therein.

There have been several different methods developed in an attempt to increase the "shelf-life" of plastic containers. One of the most common methods involves creating a multi-layered container having a thin barrier layer of a material such as EVOH or polyvinylidene chloride (PVdC) buried between two or more layers of a container polymer such as PET, polypropylene, polystyrene, or PVC. This multi-layer container is difficult and expensive to manufacture since the barrier layers are either expensive (EVOH) or corrosive (PVdC). Also the process for forming a multi-layered material and making a container from it may be much more complex than single-layer processes.

Another method of creating a barriered polymer container is the process known as "dip-coating". In this process a polymer bottle made of a material such as PET, is first formed into its final shape and then the additional step of dipping the container into a coating solution is performed. This solution may be of a barrier material such as PVdC. This process, in addition to adding another expensive step to the container manufacture, also introduces a material to the container that prevents easy recycling. Because of the nature of PVdC, the coating must be removed by solvents before the polymer container can undergo normal recycling. In light of the trend toward compulsive container return laws in various states and a probable federal deposit/return law, all future container designs must be quickly and easily recyclable. Dip-coated bottles do not lend themselves to easy recycling.

U.S. Pat. No. 4,478,874 issued Oct. 23, 1984 to Granville J. Hahn describes an additional process for improving the gas barrier characteristics of thermoplastic containers. The process described in the patent involves ion-plating the container with a thin, flexible layer of an inorganic oxide.

The present invention overcomes the deficiencies of the barrier-layer containers and the dip-coated containers by providing a plastic container which provides excellent barrier characteristics, is cheaply and easily treated, and can be completely recycled by conventional recycling techniques without need for removal of dip-coated layers. This is achieved by impregnating the interior surface of a normal polymer container with an inorganic material such as a metallic oxide. The impregnation is done by gasless ion plating to provide an ultrathin flexible coating of the inorganic material on the plastic substrate.

SUMMARY OF THE INVENTION

This invention provides improved apparatus for making open ended plastic containers having decreased gas permeability wherein the apparatus includes means for holding the containers, the improvement comprising an ionization and vaporization source located proximate the open end of the container.

In another aspect, this invention contemplates a method for making open ended plastic containers having decreased gas permeability that comprise the steps of: positioning said plastic container in ion coating apparatus with the open end unshielded; locating a vaporizing and ionizing source proximate said unshielded open end; and ionizing and vaporizing a material for deposition on the interior surface of the container.

BRIEF DESCRIPTION OF THE DRAWING

The foregoing and additional objects and advantages of the invention will become apparent as the following detailed description is read in conjunction with the accompanying drawing wherein like reference characters denote like parts in all views and wherein.

DESCRIPTION OF THE PREFERRED EMBODIMENT

Figure 1:
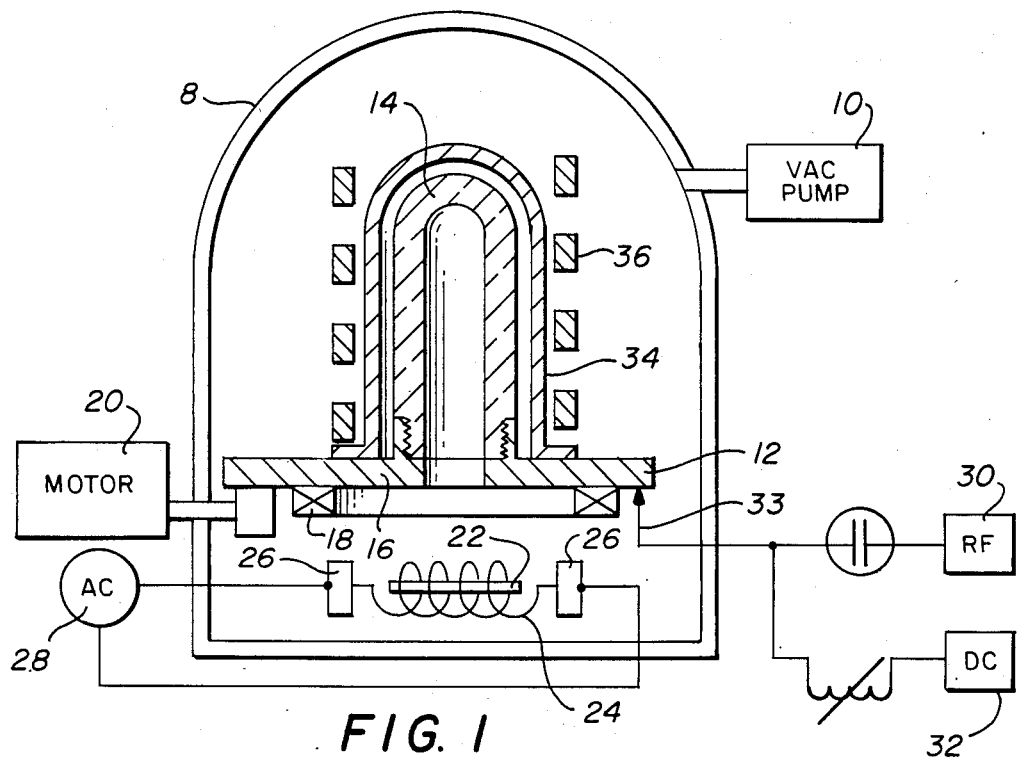
FIG. 1 is a schematic view of apparatus constructed in accordance with the invention for carrying out the process of the present invention.

Referring to FIG. 1, which is a schematic illustration not drawn to scale, illustrates a vacuum chamber 8 including a vacuum pump 10 for reducing the pressure in the chamber 8 to a desired sub-atmospheric value and having a container holding fixture 12 removably located therein. The container of FIG. 1 is an open ended plastic preform 14 that is screwed into a rotatable base 16 of the fixture 12. The base 16 of the fixture 12 is rotatably supported on a bearing 18 and is caused to rotate by a motor 20. The base 16 has an opening 17 extending therethrough in general alignment with the open end of the preform 14 so that the interior of the preform is unshielded. The fixture 12 is electrically isolated from the remainder of the system.

An ionizable coating source or material 22 is held in a vaporizing filament 24. The filament 24 is electrically connected to and supported by a pair of terminals 26 forming a resistance heating element that is powered by an external AC power supply 28. The coating material 22, held in filament 24, is vaporized by heat energy.

Ionizing energy is provided by radio frequency generated by an RF source 30 and a biasing DC voltage from a DC source 32. The RF and DC are applied through appropriate circuits and the brush or commutator 33 to fixture 12. The fixture 12 acts as an antenna for radiating the RF during operation of the system.

The fixture 12 also includes a magnet support 34 that encompasses the preform 14. Also carried by the support 34 on the fixture 12 is an optional magnet 36, which may be a permanet magnet or an electro-magnet. The magnet 36 encircles the exterior of the preform 14 and sets up a magnetic field to increase the efficiency of the coating system. It is believed that the efficiency is increased by spiraling the thermionic electrons which prolongs the residency of the electrons, and thus increases the electron density in the interior of the container. This increased electron density increases the percentage of evaporant atoms that become ionized by collision with an electron.

In the event that only the interior of the preform 14 is to be plated, the support 34 can also act as a shield encompassing the exterior of the preform 14 as illustrated. If transparent materials are being plated, it may not be of great importance to prevent their plating out on the exterior. However, in the use of colored materials, it may sometimes be highly desirable to plate only the interior.

As a result of the vaporization of the coating material 22 and the ionizing and biasing field created by the DC/RF power supply and radiated by the fixture 12, a plasma of ionized aluminum (for example) forms between the filament 24 and the fixture 12. The bias aligns and stabilizes the flow of ions toward the preform 14. form 14.

The ions pass through the opening 17 and impinge on the inner surface of the preform 14 while traveling at very high velocities and apparently penetrate partially into the surface of the polymer. An even coating of the ionized material on the preform 14 can be obtained by rotating the preform 14 about one or more of its axes during the impingement cycle. The coating material 22 and the vaporizing filament 24 should be located proximate the open end of the preform 14 with a direct flow path for the vaporized material into the preform 14. Placing the filament as close as possible will provide the greatest density of ionized material in the interior and thus provide for the greatest efficiency.

The impingement cycle is maintained long enough to obtain a coating layer on the preform 14 that can adhere to and flow with the plastic because the preform 14 will eventually be expanded up to 8 times into a full sized bottle or container. The result is a clear flexible coating of aluminum oxide on the inner surface of the polyester preform 14, which penetrates partially into the polymer and plugs the interstices between the polymer chains, rendering the material substantially impermeable to gases. This plugging of the interstices is believed to be a main contributor to the improvement in gas barrier characteristics of the aluminum oxide coated container. While 500 Angstroms is considered a good coating thickness, other thicknesses ranging from less than 500 to as high as 5000 Angstroms or more might be used depending on the type of polymer, the container shape, and the size and thickness of the container.

In addition to the impingement coating of polyesters such as PET it is believed that most other polymers can also be coated successfully. It is also expected that other inorganic materials may be substituted for SiO, for example aluminum, aluminum oxide, titanium, titanium oxide, magnesium, magnesium oxide, tantalum and tantalum oxide. Most inorganic or metallic oxides should be adaptable to this process. It should also be noted that even though the metals of these plating compounds are generally opaque, their oxides are clear and thus they can be used on both clear and pigmented polymers without affecting the aesthetics of the containers.

Recyclability of the used coated containers is not affected detrimentally because of the extremely small amount of inorganic coating used. Because of its inert nature and presence in small amounts, the coating will not be noticeable in the recycled polymer. The amount of inorganic coating is less than 1% by weight of the polymer in the container. Some containers have inorganic pigments such as titanium dioxide mixed with their polymers in amounts as high as 25% by weight without affecting recyclability; therefore it can be seen how negligible the effect of the coating material is on recyclability using the present invention.

Figure 2:
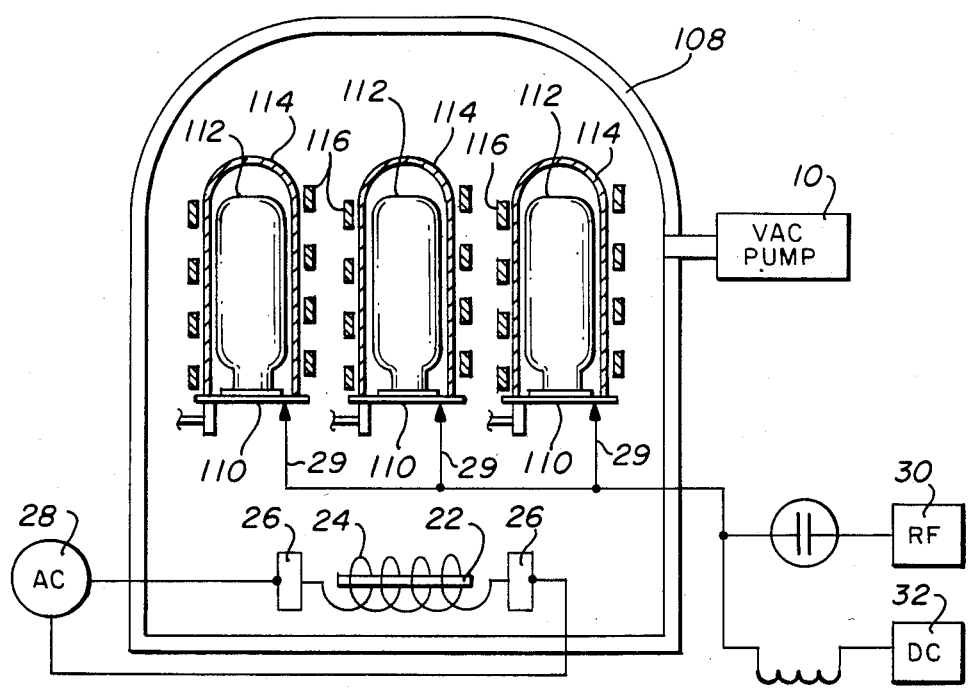
FIG. 2 is a schematic view of a modified form of the apparatus of FIG. 1 that is also constructed in accordance with the invention.

The Embodiment of FIG. 2

Referring to FIG. 2, shown therein is apparatus for carrying out the process of the invention. Where the components of the apparatus of FIG. 2 are identical to those of FIG. 1, they will be designated by the same reference characters used on those parts in the description of the embodiment of FIG. 1.

The apparatus of FIG. 2 includes a vacuum chamber 108 that is provided with a vacuum pump 10 to permit lowering of the pressure within the chamber 108 to the desired subatmospheric value.

As described in connection with FIG. 1, the filament 24 is supported between terminals 26 for the purpose of vaporizing the coating material 22. The terminals 26 are connected to a source of A/C power 28. A radio frequency source 30 and a DC voltage source 32 are connected by appropriate circuits and through brushes or communtators 33 to a plurality of rotatable bottle holders 110.

The holders 110 are arranged to be rotated by the motor 20 of FIG. 1 and are located in the chamber 108. Each of the rotatable bottle holders 110 has a bottle 112 mounted thereon for rotation therewith. Also mounted for rotation on each of the rotatable bottle holders 110 is a magnet support 114 which encompasses each of the bottles 112 and, encircling each support 114 is a magnet 116. The supports 114 and the magnets 116 provide the same functions previously described in connection with the support 34 and magnet 36 of the embodiment of FIG. 1.

The apparatus of FIG. 2 ionizes the material 22 which is then deposited on the interior of the bottles 112. The support 114, if configured as a shield, prevents the deposit on the exterior of the bottles 112. Rotation of the bottles 112 on the holders 110 aid in assuring that the layer of ionized material on each bottle 112 is are uniformly deposited on the interior surface of the bottles.

In the embodiment of FIG. 2, a substantially thinner layer of ionized material can be deposited on the interior surface of the bottles as compared to the deposition in the preform of FIG. 1. The difference in thickness results from the fact that the preform 14 of FIG. 1 is not a finished product. The preform 14 will be later heated and expanded to form completed bottles such as the bottles 112 of FIG. 2. In both cases, the ionized material is preferably deposited on the interior surface of the container. Relatively brittle materials, such as a silicon monoxide, can be deposited on the bottles 112 since no further expansion or stretching of the plastic occurs.

As compared to the deposition of ionized materials on the exterior of the bottles as taught in the prior art, the deposition of the ionized material on the interior of the bottle provides the advantage of not being subjected to inadvertent damage or partial destruction due to rough handling of the bottles. Stated in another way, the interior deposition of the material on the bottles provides a bottle having a greater integrity with respect to the possible permeation of gas either into or out of the bottle because it is less susceptible to damage. Thus, the bottles are more reliable from the standpoint of preventing either loss of gas from carbonated drinks or preventing spoilage of food due to the ingress of oxygen through the wall of the bottles.

Although specific embodiments of the present invention have been described in the detailed description above, the description is not intended to limit the invention to the particular forms or embodiments disclosed therein since they are to be recognized as illustrative rather than restrictive and it will be obvious to those skilled in the art that the invention is not so limited. For example it is contemplated that plating materials other than silicon monoxide, aluminum oxide, and titanium oxide can be used. One such material would be tantalum oxide. Also containers other than carbonated beverage bottles would benefit from the present invention, such as beer containers, food containers, and medicine containers. Thus the invention is declared to cover all changes and modifications of the specific examples of the invention herein disclosed for purposes of illustration, which do not constitute departures from the spirit and scope of the invention.

What is claimed is:

1. Apparatus for applying an ion-deposition layer of inorganic material on the interior surface of an open-ended hollow thermoplastic article, said apparatus comprising:
    a vacuum chamber;
    a vacuum source operably communicating with the interior of said vaccum chamber;
    an article holder in said vacuum chamber, adapted for receiving and supporting an open-ended hollow thermoplastic article;
    said article holder having an opening therethrough arranged to communicate with an open end of an open-ended hollow thermoplastic article located thereon;
    a source of inorganic coating material located in said vacuum chamber in close proximity to said opening in said article holder;
    a vaporizing energy element operably associated with said source of coating material and adapted to provide sufficient energy thereto to cause vaporization thereof;
    an ionization energy source in said chamber arranged to ionize vaporized material emitted from said source of material; and,
    a biasing energy source connected to said article holder and arranged to bias ions of coating material into impinging the interior surface of an open-ended container located on said holder.

2. The ion-deposition apparatus of claim 1 further comprising magnet means in said chamber arranged for placement around a thermoplastic article located on said article holder and adapted to apply a magnetic field to the interior of an article on said article holder.

3. The ion-deposition apparatus of claim 1 further comprising an external shield adapted to be placed on said article holder in such a manner as to shield the exterior surface of an article on said article holder.

4. The ion-deposition apparatus of claim 1 further comprising external shield means adapted to be placed on said article holder in such a manner as to shield the exterior surface of an article on said article holder, and magnet means located on said shield means adapted to generate a magnetic field inside an article located on said article holder.

5. The ion-deposition apparatus of claim 1 further comprising motor means connected to said holder means, and rotation means associated with said holder means, both adapted to provide rotation of said holder means.

6. The ion-deposition apparatus of claim 1 wherein said ionization energy source and said biasing energy source comprise RF and DC energy sources connected to said article holder.

7. A method of ion-deposition of an inorganic material on the interior surface of a hollow thermoplastic article having an open end, said method comprising:
    placing the open end of a hollow thermoplastic article on an article holder having an opening therethrough;
    said holder being located in a vacuum chamber and having ionizing and biasing energy sources connected thereto;
    placing a source of inorganic deposition material in close proximity to said opening in said article holder, with a vaporization means associated with said source of material;
    drawing a vacuum in said vacuum chamber; and,
    simultaneously vaporizing said inorganic material and applying an ionizing and biasing energy to said holder, thereby biasing ionized particles of deposition material through the opening of said article holder and into the interior of a hollow thermoplastic article located thereon.

8. The ion-deposition method of claim 7 further comprising the step of shielding the exterior surface of an article on said article holder.

9. The ion-deposition method of claim 7 further comprising the step of generating a magnetic field inside an article on said article holder during said vaporizing step.

10. The ion-deposition method of claim 7 further comprising the step of rotating said article holder around at least one of its axes during at least a portion of said vaporizing step.

* * * * *